(12) United States Patent
Whitney

(10) Patent No.: US 6,507,264 B1
(45) Date of Patent: Jan. 14, 2003

(54) INTEGRAL FUSE FOR USE IN SEMICONDUCTOR PACKAGES

(75) Inventor: Stephen J. Whitney, Lake Zurich, IL (US)

(73) Assignee: Littelfuse, Inc., Des Plaines, IL (US)

( * ) Notice: Subject to any disclaimer, the term of this patent is extended or adjusted under 35 U.S.C. 154(b) by 165 days.

(21) Appl. No.: 09/649,113

(22) Filed: Aug. 28, 2000

(51) Int. Cl.[7] ............... H01H 85/08; H01H 85/044; H01L 23/62
(52) U.S. Cl. ............... 337/159; 337/158; 337/295; 337/405; 257/690
(58) Field of Search ............... 337/158, 159, 337/401, 1, 405, 406, 298, 295, 297, 160; 257/665, 696, 690; 327/525

(56) References Cited

U.S. PATENT DOCUMENTS

| | | | |
|---|---|---|---|
| 3,699,395 A | 10/1972 | Boleky | 148/DIG. 122 |
| 3,778,886 A | 12/1973 | Shields et al. | 148/DIG. 20 |
| 4,038,677 A | 7/1977 | Nagel et al. | 257/529 |
| 4,042,950 A | 8/1977 | Price | 148/DIG. 20 |
| 4,121,277 A | 10/1978 | Hilbert | 337/290 |
| 4,272,753 A | 6/1981 | Nicolay | 337/297 |
| 4,547,830 A | 10/1985 | Yamauchi | 337/159 |
| 4,935,848 A | 6/1990 | Yamane et al. | 361/534 |
| 4,943,842 A | 7/1990 | Sugita et al. | 257/665 |
| 4,945,398 A | 7/1990 | Kurita et al. | 257/665 |
| 5,034,846 A * | 7/1991 | Hodge et al. | 361/119 |
| 5,332,990 A | 7/1994 | Duerr et al. | 337/290 |
| 5,546,267 A | 8/1996 | Frederiksen et al. | 361/119 |
| 5,644,281 A * | 7/1997 | Kuriyama | 337/295 |
| 5,905,623 A | 5/1999 | McCartney | 361/113 |

FOREIGN PATENT DOCUMENTS

| | | | | |
|---|---|---|---|---|
| JP | 3-165573 A | 7/1991 | | 257/665 |
| JP | 5-6729 A | 1/1993 | | 337/227 |
| JP | 5-145005 A | 6/1993 | | 257/529 |
| JP | 5-234495 A | 9/1993 | | 337/241 |

* cited by examiner

*Primary Examiner*—Anatoly Vortman
(74) *Attorney, Agent, or Firm*—Bell, Boyd & Lloyd LLC

(57) ABSTRACT

A fuse element partially encapsulated in an arc-suppression material which can, in turn, be integrated along with a semiconductor device into a semiconductor package to provide overcurrent protection, as well as a method of integrating such a fuse along with a semiconductor device into a semiconductor package wherein the semiconductor package has a standard form factor based on the semiconductor device integrated within.

25 Claims, 2 Drawing Sheets

INTEGRAL FUSE FOR USE IN SEMICONDUCTOR PACKAGES

BACKGROUND OF THE INVENTION

The present invention relates to a fuse which is integrally-formed within a semiconductor package, to a semiconductor apparatus having both a semiconductor device and a fuse integrally-formed within a semiconductor package, to a method of integrating a fuse into a semiconductor package, and to a method of providing overcurrent and overvoltage protection to a telecommunications circuit.

Fuses long have been used to provide overcurrent protection to a circuit in a wide variety of applications. Fundamental operation of a fuse requires that a typically metallic fuse element open up or break via self-heating upon a predetermined overcurrent condition.

Subminiature fuses, or microfuses, are terms which are known in this field to describe very small fuses that are particularly useful to protect electronic components and circuitry on a printed circuit board. Indeed, as the continued miniaturization of electronic circuits occurs, so too must the miniaturization occur for the associated components—including fuses.

Known microfuses typically have a rigid glass or ceramic tube and a metallic fuse element housed within. Surrounding the fuse element within the tube might be air, gas, or some other arc-suppression filler material. Two respective ends of such fuse element typically extend out from the associated housing such that the fuse may be physically secured to a printed circuit board via the hard wire attachment of these ends to a metallic connection on the printed circuit board. A fuse size, or rating, is typically determined for a particular application whereupon the proper fuse may be attached as a discrete component to the associated printed circuit board.

This discrete component approach, however, requires that the fuse be properly coordinated and matched with the circuitry and components for each particular application so as to satisfy the preferred overcurrent protection criteria. Also, a discretely packaged fuse is typically sourced separately from other components on the printed circuit board, thus adding increased cost to the final product. Furthermore, of course, the more discrete components which are attached to a printed circuit board, the more physical space will be required.

SUMMARY OF THE INVENTION

There is, therefore, a need for an improved semiconductor apparatus which is able to combine both a fuse and at least one semiconductor device in a discrete integral semiconductor package to more easily assure coordination and matching of the fuse and semiconductor devices. In addition, there is a need for such a discrete integral semiconductor package approach which affords lower final product cost and reduces the physical space consumed in a printed circuit.

These and other advantages are provided by the present invention wherein a fuse may be flexibly configured to be integrally-formed with a semiconductor device in a common semiconductor package to form a single discrete circuit element which is, preferably, no larger than the semiconductor package previously known in the art for housing such semiconductor device alone.

Accordingly, in an embodiment of the present invention, a fuse integrally-formed within a unitary semiconductor package is provided which includes: a fuse element; and an encapsulant formed around the fuse element, wherein the fuse may be flexibly configured for the integral formation within the semiconductor package.

In another embodiment of the fuse, the encapsulant is formed of an arc-suppression material.

In another embodiment of the fuse, the fuse element includes first and second ends which remain uncovered from the encapsulant.

In another embodiment of the fuse, the first and second ends connect to portions of a circuit within the semiconductor package.

In another embodiment of the fuse, the fuse is electrically connected to at least one semiconductor device which is integrally-formed within the semiconductor package.

In another embodiment of the fuse, the semiconductor device is an overvoltage protection device.

In another embodiment of the fuse, the semiconductor package has a determined form factor based on the semiconductor device integrally-formed within.

In an alternative embodiment of the present invention, a semiconductor apparatus is provided which includes: a unitary semiconductor package; at least one semiconductor device integrally-formed within the semiconductor package; and a fuse integrally-formed within the semiconductor package.

In another embodiment of the semiconductor apparatus, the fuse is electrically connected to the semiconductor device.

In another embodiment of the semiconductor apparatus, the fuse is made up of a fuse element with an encapsulant formed around the fuse element, the fuse being flexibly configured for the integral formation within the semiconductor package.

In another embodiment of the semiconductor apparatus, the encapsulant is formed of an arc-suppression material.

In another embodiment of the semiconductor apparatus, the fuse element includes first and second ends which remain uncovered from the encapsulant.

In another embodiment of the semiconductor apparatus, the first and second ends connect to portions of a circuit within the semiconductor package, the semiconductor device also being connected to the circuit.

In another embodiment of the semiconductor apparatus, the semiconductor device is an overvoltage protection device.

In another embodiment of the semiconductor apparatus, the semiconductor package has a determined form factor based on the semiconductor device integrally-formed within.

In another alternative embodiment of the present invention, a method is provided of integrating a fuse within a semiconductor package, wherein the method includes the steps of: providing a unitary semiconductor package; providing at least one semiconductor device for integral formation within the semiconductor package; providing a fuse for integral formation within the semiconductor package; and integrally-forming both the semiconductor device and the fuse within the semiconductor package, such that the semiconductor device is electrically connected to the fuse.

In another embodiment of the method of integrating a fuse within a semiconductor package, the method further includes the step of flexibly configuring the fuse to fit within the semiconductor package.

In another embodiment of the method of integrating a fuse within a semiconductor package, the method further includes the step of forming the fuse from a fuse element with an encapsulant formed around the fuse element.

In another embodiment of the method of integrating a fuse within a semiconductor package, the method further includes the step of forming the encapsulant from an arc-suppression material.

In another embodiment of the method of integrating a fuse within a semiconductor package, the semiconductor device is an overvoltage protection device.

In another embodiment of the method of integrating a fuse within a semiconductor package, the method further includes the step of forming the semiconductor package to have a determined form factor based on the semiconductor device integrally-formed therein.

In yet another alternative embodiment of the present invention, a method of providing overcurrent and overvoltage protection to a telecommunications circuit is provided which includes the steps of: providing a semiconductor apparatus having both a fuse and an overvoltage protection device integrally-formed within a semiconductor package; providing a plurality of terminals which are electrically connected to the fuse and the overvoltage protection device, the plurality of terminals protruding out from the semiconductor package; and connecting the plurality of terminals to the telecommunications circuit.

In another embodiment of the method of providing overcurrent and overvoltage protection to a telecommunications circuit, the method further includes the steps of: electrically connecting the fuse between first and second terminals of the plurality of terminals; and electrically connecting the overvoltage protection device between the second and third terminals of the plurality of terminals.

In another embodiment of the method of providing overcurrent and overvoltage protection to a telecommunications circuit, the method further includes the steps of: electrically connecting one of the first and second terminals to a first incoming line to the telecommunications circuit and electrically connecting the other of the first and second terminals to the telecommunications circuit such that the fuse is connected in series with the telecommunications circuit; and electrically connecting the third terminal to a second incoming line to the telecommunications circuit such that the overvoltage protection element is connected in parallel with the telecommunications circuit.

In another embodiment of the method of providing overcurrent and overvoltage protection to a telecommunications circuit, the method further includes the step of opening the fuse via self-heating of the fuse at a determined overcurrent level.

In another embodiment of the method of providing overcurrent and overvoltage protection to a telecommunications circuit, the method further includes the step of opening the fuse upon a determined combination of self-heating of the fuse at a minor overcurrent level and conduction heating from the overvoltage protection device due to a continuous overvoltage condition.

Additional features and advantages of the present invention are described in, and will be apparent from, the following Detailed Description of the Presently Preferred Embodiments and the Drawings.

BRIEF DESCRIPTION OF THE FIGURES

Reference is made to the attached drawings, wherein elements having the same reference numeral represent like elements throughout and wherein.

DETAILED DESCRIPTION OF THE PRESENTLY PREFERRED EMBODIMENTS

Figure 1A:
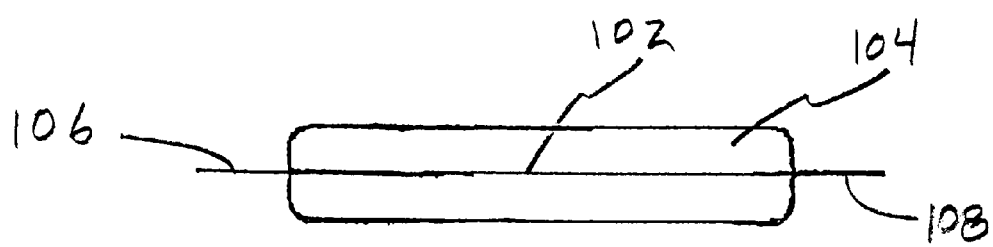
FIGS. 1a–1d show alternative embodiments of the fuse of the present invention.

FIGS. 1a through 1d represent exemplary alternative embodiments of the fuse of the present invention. Turning first to FIG. 1a, the fuse shown includes a wire or strip fuse element 102 which is substantially encapsulated by an encapsulant 104. The fuse element 102 is typically a metallic piece which may be either plated or unplated. The encapsulant 104 is formed from an arc-suppression material such as, for example, ceramic, glass, PTFE or melamine. As further shown in FIG. 1a, first and second ends 106, 108 of the fuse element 102 remain uncovered from the encapsulant 104 so that the fuse may be subsequently connected to an electrical circuit.

Figure 1B:
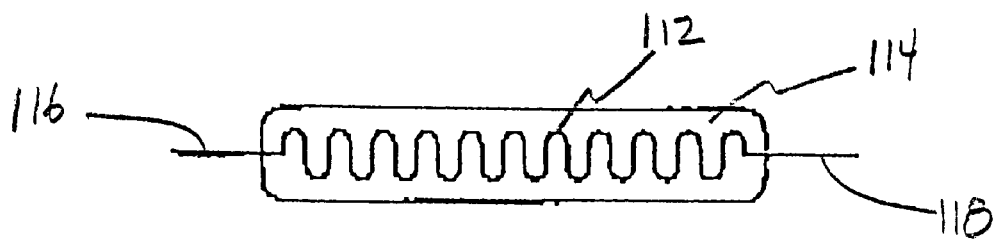

FIG. 1b offers an alternative embodiment of the fuse of the present invention wherein the fuse element 112 is formed of a crinkled or corrugated wire as is common in the fuse industry. Otherwise, the fuse shown in FIG. 1 is substantially the same as that shown in FIG. 1a and includes an encapsulant 114 which substantially encapsulates the fuse element 112 except for first and second ends 116, 118 which extend therefrom.

Figure 1C:
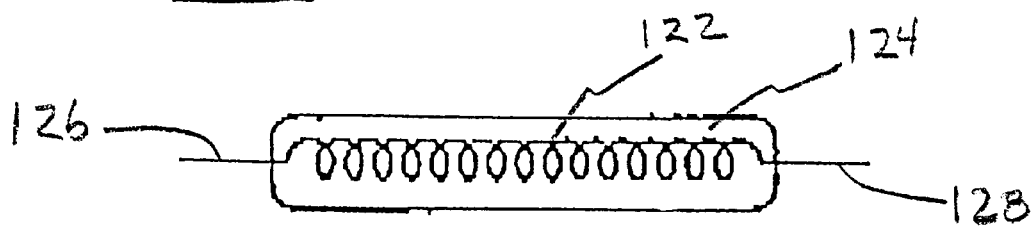

FIG. 1c offers another alternative embodiment of the fuse of the present invention wherein the fuse element 122 is formed of a spiral-wound wire having first and second ends 126, 128 extending outward therefrom. The fuse element 122 is also substantially encapsulated by the encapsulant 124.

Figure 1D:
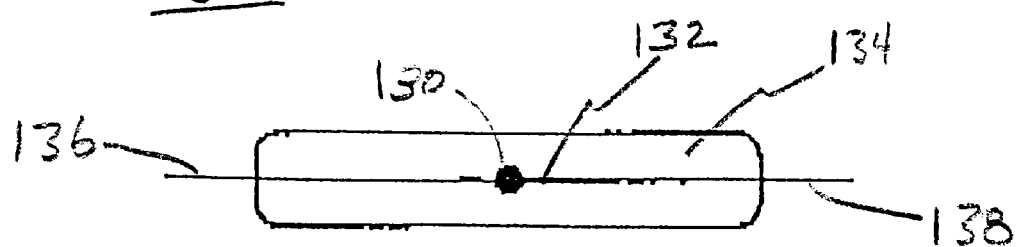

Lastly, as shown in FIG. 1d, another embodiment of the fuse of the present invention is shown which includes a fuse element 132 formed of a wire or strip having an M-spot (Metcalf spot) 130. Such configuration is also known in this field of art wherein two dissimilar metals are combined to serve as the fuse element 132. As with the previous embodiments shown, the fuse element 132 includes first and second ends 136, 138 which remain uncovered from the associated encapsulant 134.

Figure 2:
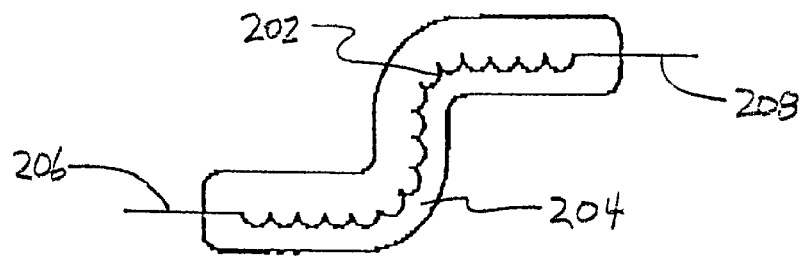
FIG. 2 shows an embodiment of the fuse of the present invention in a flexible configuration.

Referring now to FIG. 2, a fuse of the present invention is shown which again includes a fuse element 202 substantially encapsulated by an encapsulant 204, except for first and second ends 206, 208 of the fuse element 202. The fuse shown in FIG. 2 is intended to be representative of any of the various embodiments shown in FIGS. 1a through 1d. It is emphasized here that the fuse of the present invention is intended to be flexible and not self-supporting in design wherein it may be physically configured into various shapes. The material characteristics of the encapsulant 204 are such that the fuse element 202 will be substantially protected and supported during the handling of the fuse, yet the fuse will be flexible enough to be configured into various shapes, i.e., it is self-supporting, yet non-rigid. First and second ends 206, 208 of the fuse element 202 remain uncovered from the encapsulant 204 so that they may be connected to other portions of a circuit.

Figure 3:
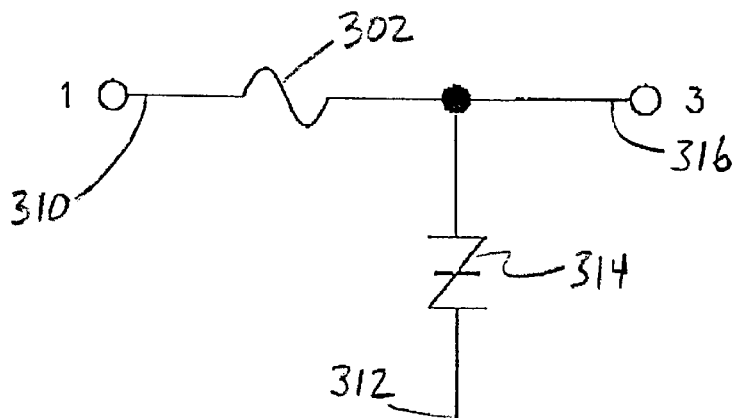
FIG. 3 shows a circuit diagram for a conventional overcurrent and overvoltage protection circuit for telecommunications equipment.

FIG. 3 shows a circuit diagram for a conventional overcurrent and overvoltage circuit which may be connected to, for example, telecommunications equipment. The physical manifestation of the components shown in FIG. 3 will be discussed in detail with reference to FIG. 4, wherein the beneficial attributes of the fuse of the present invention will be exemplified. The circuit of FIG. 3 includes a fuse 302 which is placed in series with an incoming line to a telecommunications system either in a tip line, which connects to terminal 1 (310) or in a ring line, which connects to terminal 2 (312). In the example shown, the fuse 302 is connected in the tip line between terminal 1 (310) and a terminal 3 (316) which connects to the associated telecommunications system. As such, the fuse 302 protects both the tip and ring wiring and a bi-directional thyristor 314 from excessive energy in the event a continuous overvoltage is coupled to the wiring, as might occur if a power line falls across the wiring.

In order to limit overvoltage conditions, an overvoltage device such as the bi-directional thyristor 314 is connected across the tip and ring lines between terminals 3 (316) and 2 (312) in parallel with the associated telecommunications system. The thyristor 314 provides bi-directional "crow-bar" clamping of transients that may occur for either polarity. In particular, the thyristor 314 has a breakdown voltage at which a transient voltage exceeding this value will cause the thyristor 314 to begin clamping action across the tip and ring lines. As the transient voltage attempts to rise higher, the current through the thyristor 314 will increase until a breakover voltage is reached. At this point, thyristor action is triggered and the thyristor 314 switches to its "on" or "latched" state. This is a very low impedance state that shunts or "crow-bars" the line, thereby suppressing the magnitude of the transient voltage. When the transient voltage diminishes, the thyristor 314 turns off and reverts to a high impedance "off" state.

The protection circuits used in telecommunication applications, such as that shown in FIG. 3, commonly utilize discretely packaged fuse and thyristor components connected via printed circuit board wiring. Pursuant to the present invention, however, such components may be jointly packaged within a single semiconductor package.

Figure 4:
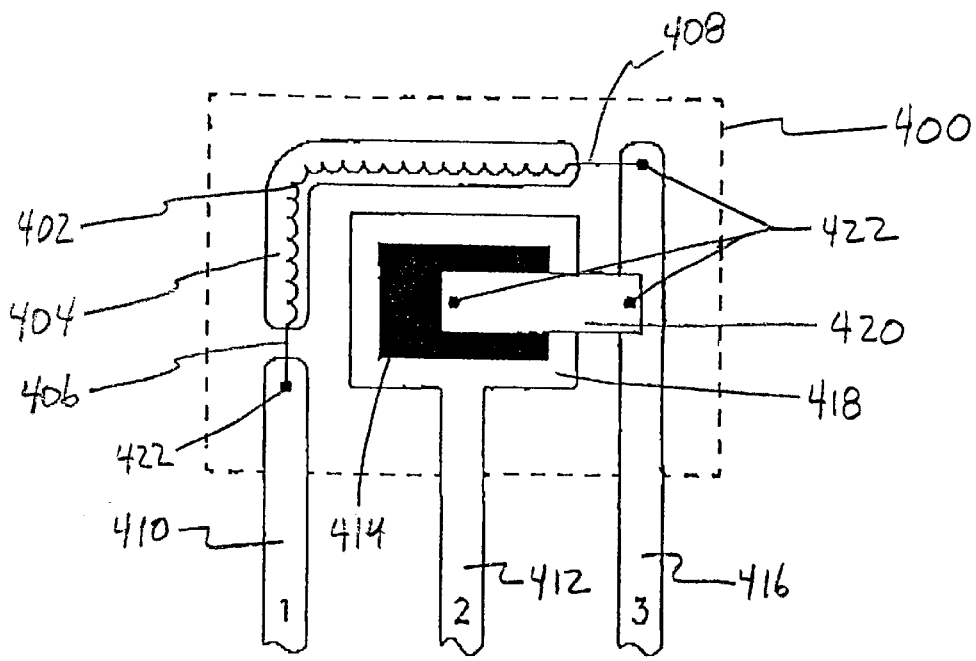
FIG. 4 shows an exemplary embodiment of the semiconductor apparatus of the present invention which is associated with the circuit diagram shown in FIG. 3.

Turning now to FIG. 4, the semiconductor apparatus of the present invention is shown which includes a unitary semiconductor package 400. Integrally-formed within the semiconductor package 400 are both a fuse and a semiconductor device. As shown, the fuse is representative of the embodiments already discussed and includes a fuse element 402 encapsulated by an encapsulant 404. Extending therefrom are first and second ends 406, 408. The exemplary semiconductor device, with which the fuse is integrally-formed within the semiconductor package 400, is a thyristor 414 mounted upon a bond pad 418.

The semiconductor package 400 is designed to have a determined form factor which is based upon the associated semiconductor device; in this case, the thyristor 414. The preferred embodiment of the present invention contemplates that such form factor of the semiconductor package 400 need not be changed so as to accommodate the inventive fuse therein. Rather, the fuse element 402 encapsulated by the encapsulant 404 is flexibly configured so as to be accommodated within the semiconductor package 400 having the existing form factor. Indeed, the encapsulant 404 is intended to protect the fuse element 402 from damage during a semiconductor package 400 molding operation. In addition, the encapsulant 404 serves to prevent the carbonization of the semiconductor package 400, which is preferably plastic, which could otherwise result in low isolation resistance after fuse operation. After the various components, including first and second ends 406, 408 of the fuse element 402, are connected via weld points 422, the semiconductor package 400 becomes a unitary device having only terminals 1, 2 and 3 (410, 412 and 416, respectively) extending therefrom.

It is contemplated that the fuse of the present invention could be integrally-formed within any number of semiconductor packages known in this field of art. For example, the fuse of the present invention has applicability to any of the packages disclosed in Publication 92 from the Electronic Industries Association/Joint Electronic Device Engineering Counsel.

FIG. 4 exemplifies not only the fundamental concept of integrating a fuse into a known semiconductor package, but also a preferred application of the present invention. Again, the overall circuit shown is intended to provide both overcurrent and overvoltage protection to a telecommunications circuit. To complete the circuit, the first end 406 of the fuse element 402 is connected to terminal 1 (410), second end 408 is connected to terminal 3 with another weld point 422, bond pad 418 is either connected to or integrally-formed with terminal 2 (412), and connector piece 420 connects the thyristor 414 to terminal 3 (416) via additional weld points 422. When used to protect a telecommunications circuit, the tip and ring lines of an incoming twisted pair are connected to terminal 1 (410) and terminal 2 (412), and the communications circuit is connected via terminal 2 (412) and terminal 3 (416). Normally, voltage transients which are induced by a nearby lightning strike present a high voltage condition at terminals 1 and 2. The thyristor 414 simply operates to suppress that high voltage so that it does not damage the downstream telecommunications equipment.

However, the more difficult situation to deal with involves a power cross condition. A power cross condition occurs when, for example, a power line falls across a phone line or vice versa. Such high voltage power line may lay across the phone line without any actual metallic contact therebetween. Regardless, such high voltage power line might still induce a high voltage condition on the tip and ring lines. Indeed, this may well be 600 V which is what the North American standards require that an overvoltage protection device be able to interrupt. As such, the thyristor 414 will see the 600 V and will attempt to clamp it. However, the thyristor 414 will clamp this high voltage continuously because it is a continuous overvoltage condition. Under these circumstances the thyristor 414 might get extremely hot and actually flame, or the tip and ring lines might actually flame as well. During this time the overcurrent protection device, or fuse, will not open because the transient current associated with the power cross condition is relatively small, perhaps only 200–300 milliamps. For this reason, power cross conditions are sometimes called "sneak current" conditions as well.

In light of the above, it is preferable to have a fuse open before the thyristor or associated wiring begin to flame, even though the transient current is relatively low. The present invention accomplishes this task as follows. As the thyristor 414 clamps, it begins to self-heat wherein a good deal of energy is dissipated. Given that the thyristor 414 and fuse element 402 are integrally-formed within the unitary semiconductor package 400, they are in close proximity to each other such that the excessive heat from the thyristor 414 is coupled to the fuse element 402. Such coupling reduces the fuse element's ability to carry the rated current. Basically, the fuse element 402 becomes heated both via its own self-heating effect from the sneak current condition as well as from the heat being dissipated by the thyristor 414 due to the overvoltage condition. Thus, the fuse element 402 will melt, or open, so as to prevent the dangerous effects of overheating described above. If the fuse were a discrete component separate and apart from the thyristor 414, it would be extremely difficult to get the heating affect from the thyristor 414 to couple to the fuse.

The integral formation of a fuse and a semiconductor device within a single semiconductor package provides the assurance that such components are properly matched. Moreover, the additional space requirements for two discrete component packages is eliminated, thereby reducing the physical space needed on a printed circuit board, for example. In addition, the integration of a fuse and semiconductor device in a single package may avoid problems associated with separately sourcing components and interconnecting such components made by different suppliers. Such approach would further reduce the cost of a final product since a single manufacturer could supply the entire semiconductor package.

It should be understood that various changes and modifications to the presently preferred embodiments described herein will be apparent to those skilled in the art. Such changes and modifications can be made without departing from the spirit and scope of the present invention and without diminishing its attended advantages. It is therefore intended that such changes and modifications be covered by the hereafter appended claims.

What is claimed is:

1. A fuse integrally-formed within a unitary semiconductor package, comprising:
    a wire fuse element that is threadlike and not self-supporting;
    a self-supporting encapsulant formed around the fuse element, wherein the fuse element and the encapsulant are collectively flexible, self-supporting and bent in at least one place so as to be operable within the semiconductor package; and
    a portion of the fuse element exposed and connected electrically within the semiconductor package.

2. A fuse as claimed in claim 1, wherein the encapsulant is formed of an arc-suppression material.

3. A fuse as claimed in claim 1, wherein the fuse element includes first and second ends which remain uncovered from the encapsulant.

4. A fuse as claimed in claim 3, wherein the first and second ends connect to portions of a circuit within the semiconductor package.

5. A fuse as claimed in claim 1, wherein the fuse element has a shape selected from the group consisting of: a corrugated shape, a spiral wound shape and a shape due at least in part to a Metcalf spot.

6. A fuse as claimed in claim 1, wherein the semiconductor device is an overvoltage protection device.

7. A fuse as claimed in claim 5, wherein the semiconductor package has a determined form factor based on the semiconductor device integrally-formed within.

8. A semiconductor apparatus, comprising:
    a unitary semiconductor package;
    at least one semiconductor device disposed within the semiconductor package; and
    a fuse including an encapsulated fuse element disposed within the semiconductor package so as to avoid physical contact with the semiconductor device and connected directly electrically to a pair of terminals that extend from the semiconductor package, at least one of the terminals connected electrically to the semiconductor device.

9. A semiconductor apparatus as claimed in claim 8, wherein the fuse is further comprised of a fuse element with an encapsulant formed around the fuse element, the fuse being flexibly configured for the integral formation within the semiconductor package.

10. A semiconductor apparatus as claimed in claim 9, wherein the encapsulant is formed of an arc-suppression material.

11. A semiconductor apparatus as claimed in claim 9, wherein the fuse element includes first and second ends which remain uncovered from the encapsulant.

12. A semiconductor apparatus as claimed in claim 11, wherein the first and second ends connect to portions of a circuit within the semiconductor package, the semiconductor device also being connected to the circuit.

13. A semiconductor apparatus as claimed in claim 8, wherein the semiconductor device is an overvoltage protection device.

14. A semiconductor apparatus as claimed in claim 8, wherein the semiconductor package has a determined form factor based on the semiconductor device integrally-formed within.

15. A semiconductor apparatus as claimed in claim 8, wherein the semiconductor device includes an overvoltage protection device.

16. A method of integrating a fuse within a semiconductor package, the method comprising the steps of:
    disposing at least one semiconductor device within the semiconductor package; and
    flexibly configuring a fuse that includes an encapsulant covering a portion of a fuse element within the semiconductor package so that the fuse extends around the semiconductor device and so that the fuse connects directly electrically to a plurality of terminals; and
    connecting at least one of the terminals electrically to the semiconductor device.

17. A method of integrating a fuse within a semiconductor package as claimed in claim 16, further comprising the step of forming the encapsulant from an arc-suppression material.

18. A method of integrating a fuse within a semiconductor package as claimed in claim 16, wherein the semiconductor device is an overvoltage protection device.

19. A method of integrating a fuse within a semiconductor package as claimed in claim 16, further comprising the step of forming the semiconductor package to have a determined form factor based on the semiconductor device integrally-formed therein.

20. A method of integrating a fuse within a semiconductor package as claimed in claim 16, which includes connecting at least one of the terminals to the semiconductor device via a single conductor.

21. A method of providing overcurrent and overvoltage protection to a telecommunications circuit, the method comprising the steps of:
    providing a semiconductor apparatus having a fuse including an encapsulated fuse element, an overvoltage protection device and first and second terminals;
    forming the fuse so as to avoid physical contact with the overvoltage protection device;
    electrically directly connecting the fuse to the first and second terminals;
    electrically connecting at least one of the terminals to the overvoltage protection device; and
    connecting the first and second terminals to the telecommunications circuit.

22. A method of providing overcurrent and overvoltage protection to a telecommunications circuit as claimed in claim 21, further comprising the steps of:
- electrically connecting one of the first and second terminals to a first incoming line to the telecommunications circuit and electrically connecting the other of the first and second terminals to the telecommunications circuit such that the fuse is connected in series with the telecommunications circuit; and
- electrically connecting a third terminal of the semiconductor apparatus to a second incoming line to the telecommunications circuit such that the overvoltage protection device is connected in parallel with the telecommunications circuit.

23. A method of providing overcurrent and overvoltage protection to a telecommunications circuit as claimed in claim 21, further comprising the step of opening the fuse via self-heating of the fuse at a determined overcurrent level.

24. A method of providing overcurrent and overvoltage protection to a telecommunications circuit as claimed in claim 21, further comprising the step of opening the fuse upon a determined combination of self-heating of the fuse at a minor overcurrent level and conduction heating from the overvoltage protection device due to a continuous overvoltage condition.

25. A method of providing overcurrent and overvoltage protection to a telecommunications circuit as claimed in claim 21, wherein the overvoltage protection device includes a thyristor.

* * * * *